(12) United States Patent
Malige et al.

(10) Patent No.: US 9,053,100 B1
(45) Date of Patent: Jun. 9, 2015

(54) SYSTEMS AND METHODS FOR COMPRESSING DATABASE OBJECTS

(71) Applicants: Raghupathi Malige, San Jose, CA (US); Daniel Fillingham, Santa Clara, CA (US); Meher Shah, Union City, CA (US)

(72) Inventors: Raghupathi Malige, San Jose, CA (US); Daniel Fillingham, Santa Clara, CA (US); Meher Shah, Union City, CA (US)

(73) Assignee: Symantec Corporation, Mountain View, CA (US)

( * ) Notice: Subject to any disclaimer, the term of this patent is extended or adjusted under 35 U.S.C. 154(b) by 120 days.

(21) Appl. No.: 13/650,005

(22) Filed: Oct. 11, 2012

(51) Int. Cl.
*G06F 17/30* (2006.01)

(52) U.S. Cl.
CPC .......... *G06F 17/30* (2013.01); *G06F 17/30595* (2013.01)

(58) Field of Classification Search
CPC .................... G06F 17/30595; G06F 17/30501; G06F 17/30442; G06F 17/30917; G06F 17/30315
See application file for complete search history.

(56) References Cited

U.S. PATENT DOCUMENTS

| 6,879,984 | B2* | 4/2005 | Duddleson et al. .................... 1/1 |
| 2002/0040639 | A1* | 4/2002 | Duddleson et al. ................ 92/52 |
| 2008/0071818 | A1* | 3/2008 | Apanowicz et al. ........... 707/101 |
| 2009/0043792 | A1* | 2/2009 | Barsness et al. .............. 707/101 |
| 2011/0264676 | A1* | 10/2011 | Belan et al. .................... 707/756 |
| 2011/0307521 | A1* | 12/2011 | Slezak et al. .................. 707/800 |

OTHER PUBLICATIONS

Oracle; Oracle Advanced Compression; http://www.oracle.com/technetwork/database/options/compression/faq-092157.html, as accessed on Aug. 7, 2012.
Oracle; Maximize Resource Utilization and Reduce Costs; http://www.oracle.com/us/products/database/options/advanced-compression/overview/index.html, as accessed on Aug. 7, 2012.

* cited by examiner

*Primary Examiner* — Angelica Ruiz
(74) *Attorney, Agent, or Firm* — ALG Intellectual Property, LLC

(57) ABSTRACT

A computer-implemented method for compressing database objects may include 1) identifying a database object within a relational database, 2) determining that the database object meets a compression criterion that is not met by at least one additional database object within the relational database, 3) identifying a location of the database object within a database file of the relational database, and 4) compressing a portion of the database file at the location of the database object without compressing all of the database file. Various other methods, systems, and computer-readable media are also disclosed.

20 Claims, 6 Drawing Sheets

SYSTEMS AND METHODS FOR COMPRESSING DATABASE OBJECTS

BACKGROUND

In the digital age, organizations must manage increasingly large volumes of data. Some organizations may store data within databases to structure and/or organize their data. In environments with large databases, common objects such as tables and indexes may have billions of rows and occupy several gigabytes of storage. To save on storage costs, organizations may wish to compress database data.

Unfortunately, existing techniques for compressing database data may impose limitations on which data may be compressed and/or may impose unacceptable costs when compressing data. For example, some traditional database systems may include compression features for compressing updates to databases but not for existing data within the databases. Some traditional database systems may allow the compression of an existing table, but at the cost of relocating the entire table to a new container. Furthermore, compressing certain portions of databases (such as indexes with unique columns) may yield little storage savings but impose significant performance costs. Accordingly, the instant disclosure identifies and addresses a need for additional and improved systems and methods for compressing databases.

SUMMARY

As will be described in greater detail below, the instant disclosure generally relates to systems and methods for compressing database objects by identifying specific database objects to compress (e.g., selected so as to maximize space savings while minimizing performance costs), identifying database file extents that correspond to the selected database objects, and performing partial file compression on the corresponding file extents.

In one example, a computer-implemented method for compressing database objects may include 1) identifying a database object within a relational database, 2) determining that the database object meets a compression criterion that is not met by at least one additional database object within the relational database, 3) identifying a location of the database object within a database file of the relational database, and 4) compressing a portion of the database file at the location of the database object without compressing all of the database file.

Identifying the database object may involve identifying any of a variety of database objects. For example, identifying the database object may include identifying 1) an index, 2) a table, and/or 3) a set of rows.

Determining that the database object meets the compression criterion may involve any of a number of determinations. In some examples, determining that the database object meets the compression criterion may include determining that a write frequency to the database object falls below a predetermined threshold. Additionally or alternatively, determining that the database object meets the compression criterion may include 1) determining that the database object includes a table and/or 2) determining that the database object includes a composite index that indexes a plurality of columns. In some examples, determining that the database object meets the compression criterion may include determining that an age of the database object exceeds a predetermined threshold. In some embodiments, determining that the database object meets the compression criterion may include determining that the database object includes a read-only database object.

In one example, determining that the database object meets the compression criterion may include determining that a size of the database object exceeds a predetermined threshold. In one embodiment, determining that the database object meets the compression criterion may include determining that the database object includes a file stored within the relational database.

In some embodiments, identifying the location of the database object within the database file of the relational database may include querying a catalog table of the relational database that stores extent information for the database object (the extent information identifying the database file and an offset within the database file at which at least a portion of the database object is located).

In one example, compressing the portion of the database of the database file at the location of the database object without compressing all of the database file may include compressing the portion of the database file while leaving an additional portion of the database file that corresponds to the additional database object uncompressed.

In one embodiment, a system for implementing the above-described method may include 1) an identification module programmed to identify a database object within a relational database, 2) a determination module programmed to determine that the database object meets a compression criterion that is not met by at least one additional database object within the relational database, 3) a location module programmed to identify a location of the database object within a database file of the relational database, and 4) a compression module programmed to compress a portion of the database file at the location of the database object without compressing all of the database file. The system may also include at least one processor configured to execute the identification module, the determination module, the location module, and the compression module.

In some examples, the above-described method may be encoded as computer-readable instructions on a computer-readable-storage medium. For example, a computer-readable-storage medium may include one or more computer-executable instructions that, when executed by at least one processor of a computing device, may cause the computing device to 1) identify a database object within a relational database, 2) determine that the database object meets a compression criterion that is not met by at least one additional database object within the relational database, 3) identify a location of the database object within a database file of the relational database, and 4) compress a portion of the database file at the location of the database object without compressing all of the database file.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
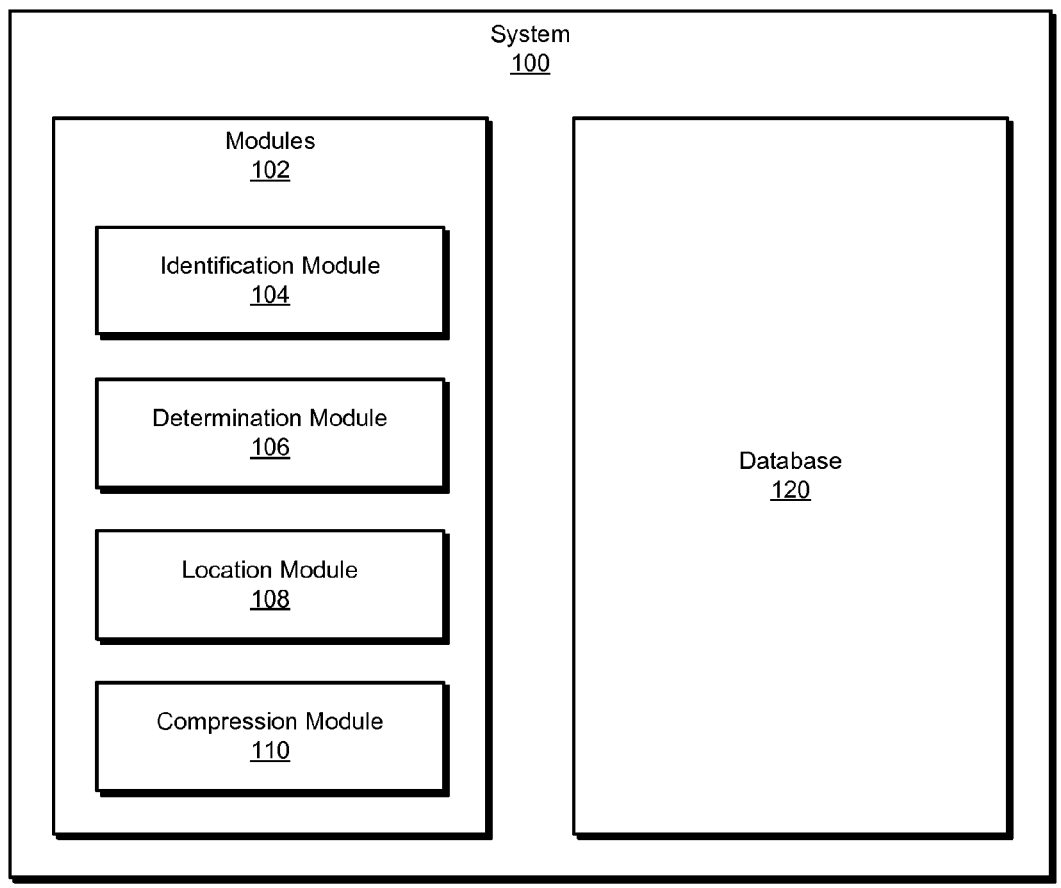
FIG. 1 is a block diagram of an exemplary system for compressing database objects.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for compressing database objects. As will be explained in greater detail below, by identifying specific database objects to compress, identifying database file extents that correspond to the selected database objects, and performing partial file compression on the corresponding file extents, the systems and methods described herein may facilitate the compression of selected database objects (including already existing database objects) so as to maximize space savings while minimizing performance costs and without requiring transferring the database objects to new containers and/or rebuilding invalidated indexes. In addition, these systems and methods may avoid compressing table free space and, in some examples, may facilitate periodic compression of past updates to databases.

Figure 2:
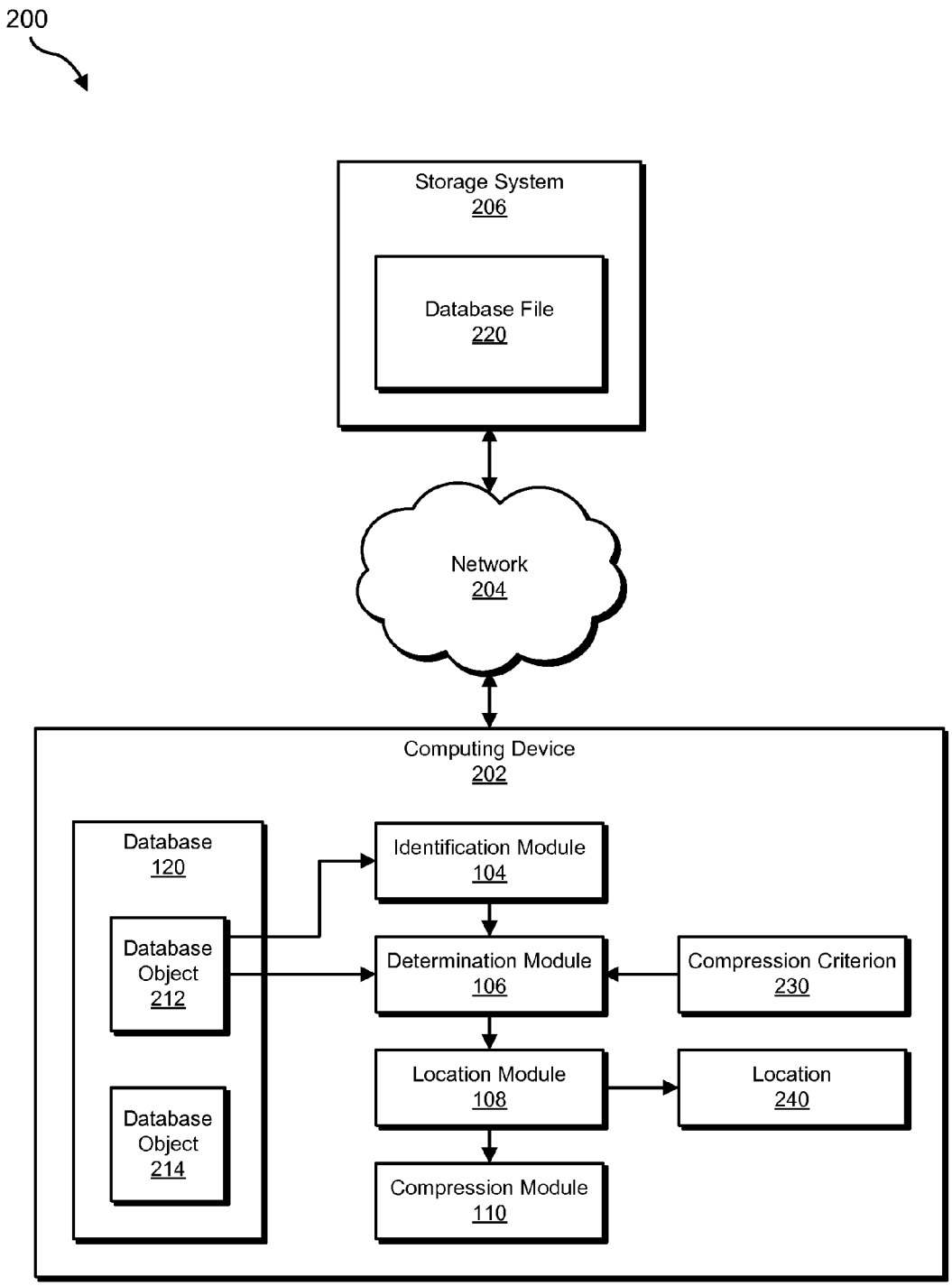
FIG. 2 is a block diagram of an exemplary system for compressing database objects.

The following will provide, with reference to FIGS. 1-2, detailed descriptions of exemplary systems for compressing database objects. Detailed descriptions of corresponding computer-implemented methods will also be provided in connection with FIG. 3. Detailed descriptions of an exemplary database will be provided in connection with FIG. 4. In addition, detailed descriptions of an exemplary computing system and network architecture capable of implementing one or more of the embodiments described herein will be provided in connection with FIGS. 5 and 6, respectively.

FIG. 1 is a block diagram of an exemplary system 100 for compressing database objects. As illustrated in this figure, exemplary system 100 may include one or more modules 102 for performing one or more tasks. For example, and as will be explained in greater detail below, exemplary system 100 may include an identification module 104 programmed to identify a database object within a relational database. Exemplary system 100 may also include a determination module 106 programmed to determine that the database object meets a compression criterion that is not met by at least one additional database object within the relational database.

In addition, and as will be described in greater detail below, exemplary system 100 may include a location module 108 programmed to identify a location of the database object within a database file of the relational database. Exemplary system 100 may also include a compression module 110 programmed to compress a portion of the database file at the location of the database object without compressing all of the database file. Although illustrated as separate elements, one or more of modules 102 in FIG. 1 may represent portions of a single module or application.

In certain embodiments, one or more of modules 102 in FIG. 1 may represent one or more software applications or programs that, when executed by a computing device, may cause the computing device to perform one or more tasks. For example, and as will be described in greater detail below, one or more of modules 102 may represent software modules stored and configured to run on one or more computing devices, such as the devices illustrated in FIG. 2 (e.g., computing device 202 and/or storage system 206), computing system 510 in FIG. 5, and/or portions of exemplary network architecture 600 in FIG. 6. One or more of modules 102 in FIG. 1 may also represent all or portions of one or more special-purpose computers configured to perform one or more tasks.

As illustrated in FIG. 1, exemplary system 100 may also include one or more databases, such as database 120. Database 120 may represent portions of a single database or computing device or a plurality of databases or computing devices. For example, database 120 may represent a portion of storage system 206 in FIG. 2, computing system 510 in FIG. 5, and/or portions of exemplary network architecture 600 in FIG. 6. Alternatively, database 120 in FIG. 1 may represent one or more physically separate devices capable of being accessed by a computing device, such as storage system 206 in FIG. 2, computing system 510 in FIG. 5, and/or portions of exemplary network architecture 600 in FIG. 6.

Exemplary system 100 in FIG. 1 may be implemented in a variety of ways. For example, all or a portion of exemplary system 100 may represent portions of exemplary system 200 in FIG. 2. As shown in FIG. 2, system 200 may include a computing device 202 in communication with a storage system 206 via a network 204. Computing device 202 may be programmed with one or more of modules 102 and/or may store all or a portion of the data in database 120. Additionally or alternatively, storage system 206 may be programmed with one or more of modules 102 and/or may store all or a portion of the data in database 120.

In one embodiment, one or more of modules 102 from FIG. 1 may, when executed by at least one processor of computing device 202 and/or storage system 206, facilitate computing device 202 and/or storage system 206 in compressing database objects. For example, and as will be described in greater detail below, one or more of modules 102 may cause computing device 202 and/or storage system 206 to 1) identify a database object 212 within database 120, 2) determine that database object 212 meets a compression criterion 230 that is not met by a database object 214 within database 120, 3) identify a location 240 of database object 212 within a database file 220 of database 120, and 4) compress a portion of database file 220 at location 240 of database object 212 without compressing all of database file 220.

Computing device 202 generally represents any type or form of computing device capable of reading computer-executable instructions. Examples of computing device 202 include, without limitation, laptops, tablets, desktops, servers, cellular phones, Personal Digital Assistants (PDAs), multimedia players, embedded systems, combinations of one or more of the same, exemplary computing system 510 in FIG. 5, or any other suitable computing device.

Storage system 206 generally represents any type or form of computing device that is capable of hosting and/or storing one or more database files. Examples of server 206 include, without limitation, application servers and database servers configured to provide various database services and/or run certain software applications.

Network 204 generally represents any medium or architecture capable of facilitating communication or data transfer. Examples of network 204 include, without limitation, an intranet, a Wide Area Network (WAN), a Local Area Network (LAN), a Personal Area Network (PAN), the Internet, Power Line Communications (PLC), a cellular network (e.g., a Global System for Mobile Communications (GSM) network), exemplary network architecture 600 in FIG. 6, or the like. Network 204 may facilitate communication or data transfer using wireless or wired connections. In one embodiment, network 204 may facilitate communication between computing device 202 and storage system 206.

Figure 3:
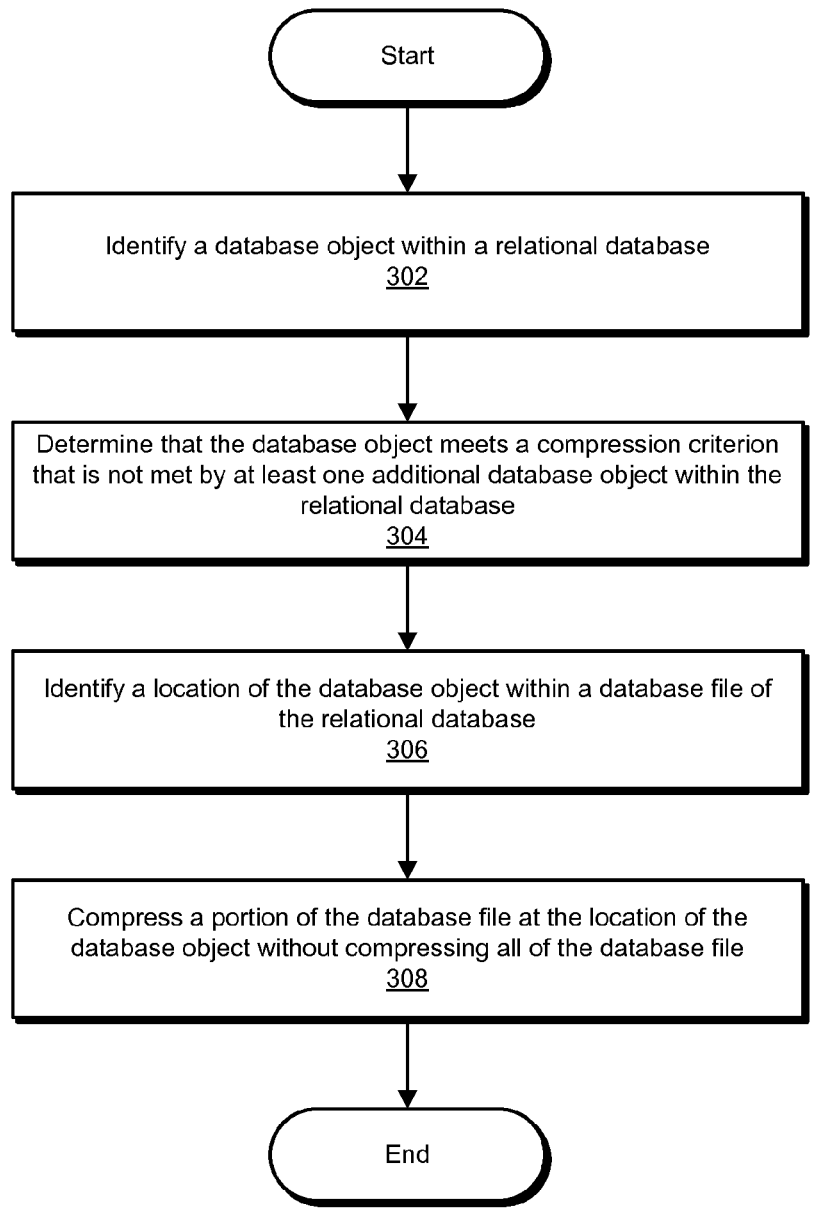
FIG. 3 is a flow diagram of an exemplary method for compressing database objects.

FIG. 3 is a flow diagram of an exemplary computer-implemented method 300 for compressing database objects. The steps shown in FIG. 3 may be performed by any suitable computer-executable code and/or computing system. In some embodiments, the steps shown in FIG. 3 may be performed by one or more of the components of system 100 in FIG. 1, system 200 in FIG. 2, computing system 510 in FIG. 5, and/or portions of exemplary network architecture 600 in FIG. 6.

As illustrated in FIG. 3, at step 302 one or more of the systems described herein may identify a database object within a relational database. For example, at step 302 identification module 104 may, as part of computing device 202 in FIG. 2, identify database object 212 within database 120.

As used herein, the phrase "relational database" may generally refer to any structured set of data. In some examples, the phrase "relational database" may refer to a collection of data structured as a relation and/or table. In some examples, the phrase "relational database" may refer to an object-relational database. The relational database may be implemented in any suitable format. For example, the relational database may be implemented within a database management system.

Identification module 104 may identify the database object in any of a variety of ways. For example, identification module 104 may identify the database object using a report generated by a database management system of the relational database (e.g., a report of access patterns of database objects within the relational database generated by a database management system at the request of identification module 104). Additionally or alternatively, identification module 104 may identify the database object by querying a catalog table of the relational database. As will be explained in greater detail below, one or more of the systems described herein may identify and/or select database objects with certain characteristics in order to selectively compress portions of one or more database files of the relational database.

Figure 4:
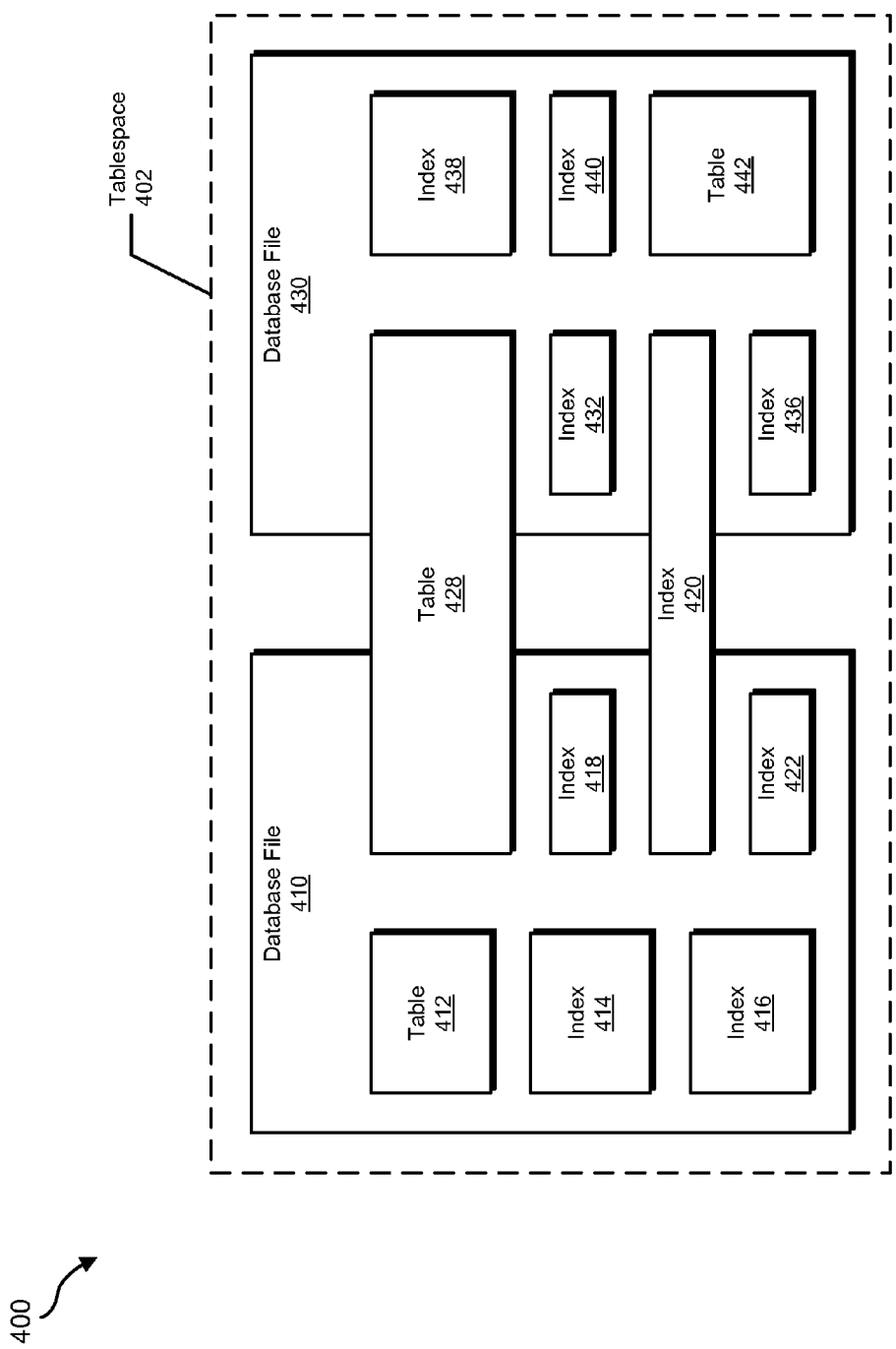
FIG. 4 is a block diagram of an exemplary database.

FIG. 4 illustrates an exemplary database 400. Using FIG. 4 as an example, database 400 may include a tablespace 402. Database files 410 and 430 may store data for tablespace 402. Database file 410 may store a table 412 and indexes 414, 416, 418, and 422. Database file 430 may store indexes 432, 436, 438, and 440 and a table 442. Database files 410 and 430 may also store a table 428 (e.g., striped across database files 410 and 430). Likewise, database files 410 and 430 may store an index 420 (e.g., spanning database files 410 and 430). As used herein, the term "tablespace" may refer to any storage location within a database relating one or more logical database objects (e.g., tables, indexes, etc.) to one or more physical storage locations. In some examples, the term "tablespace" may refer to an abstraction of one or more physical storage locations from which storage for one or more database objects may be allocated. In some examples, a tablespace may comprise one or more database segments (e.g., logical units of storage). As used herein, the phrase "database segment" may refer to any logical unit of storage that may comprise and/or correspond to one or more extents. As used herein, the term "extent" may refer to a contiguous storage location within a file (e.g., a contiguous set of blocks providing storage space for a file). In some examples, a tablespace may correspond to one or more database files. In some examples, a database file may correspond to only one tablespace. Accordingly, in some examples, one or more logical database objects within a tablespace may be striped across database files within the tablespace (e.g., across all database files within the tablespace). In these examples, a database file may therefore have portions of more than one logical database object.

Returning to FIG. 3, at step 304 one or more of the systems described herein may determine that the database object meets a compression criterion that is not met by at least one additional database object within the relational database. For example, at step 304 determination module 106 may, as part of computing device 202 in FIG. 2, determine that database object 212 meets compression criterion 230 that is not met by database object 214 within database 120.

Determination module 106 may determine that the database object meets the compression criterion may involve any of a number of determinations. For example, determination module 106 may determine that the database object meets the compression criterion by determining that a write frequency to the database object falls below a predetermined threshold. For example, determination module 106 may determine a number of write operations to the database object over a predetermined period of past time falls below a predetermined threshold. Additionally or alternatively, determination module 106 may determine that a weighted write frequency (e.g., more recent writes receiving more weight) to the database object falls below a predetermined threshold. In some examples, determination module 106 may determine that the write frequency to the database object falls below the predetermined threshold by analyzing a report on access patterns of the database object. For example, database module 106 may request an automatic workload repository report from an ORACLE database. Database module 106 may identify segment-level input/output activity from the automatic workload repository report, match the database segments to corresponding tables, and select at least one table with a low write frequency and/or with a low read frequency.

In some examples, determination module 106 may determine that the database object meets the compression criterion by 1) determining that the database object includes a table and/or 2) determining that the database object includes a composite index that indexes a plurality of columns. For example, determination module 106 may select database objects such as tables and multi-column composite indexes for compression while excluding other database objects (e.g., unique indexes that may achieve little compression). For example, determination module 106 may examine an index catalog table to identify a multi-column composite index for compression.

In some examples, determination module 106 may determine that the database object meets the compression criterion by determining that an age of the database object exceeds a predetermined threshold. For example, determination module 106 may identify a compression criterion that specifies that rows within a specified table that are older than two weeks are to be compressed (e.g., because of a projection that rows that are older than two weeks are unlikely to be accessed frequently). In some examples, determination module 106 may monitor an extent catalog table for extents from a specified table which exceed a specified age.

In some examples, determination module 106 may determine that the database object meets the compression criterion by determining that the database object includes a read-only database object. For example, determination module 106 may query a catalog table and inspect a status column of the catalog table for rows specifying a read-only status.

In some examples, determination module 106 may determine that the database object meets the compression criterion by determining that a size of the database object exceeds a predetermined threshold. Additionally or alternatively, determination module 106 may determine that the database object meets the compression criterion by determining that the database object includes a file stored within the relational database. The file may include any suitable data (e.g., x-ray images, street maps, etc.). For example, determination module 106 may query an object catalog table and inspect the object type of one or more database objects. Determination module 106 may then select one or more database objects as meeting the compression criterion according to their object type. For example, determination module 106 may select Large Objects ("LOB"), secure files, and/or XML-type objects as suitable for compression.

As will be explained in greater detail below, by selecting a database object for compression in isolation of other database objects within a database based on a compression criterion (e.g., and not compressing database objects that do not meet the compression criterion), the systems and methods described herein may achieve more efficient compression processes and results.

Returning to FIG. 3, at step 306 one or more of the systems described herein may identify a location of the database object within a database file of the relational database. For example, at step 306 location module 108 may, as part of computing device 202 in FIG. 2, identify location 240 of database object 212 within database file 220 of database 120.

Location module 108 may identify the location of the database object within the database file of the relational database in any of a variety of ways. For example, location module 108 may query a catalog table of the relational database that stores extent information for the database object. The extent information may identify the database file and an offset within the database file at which at least a portion of the database object is located. For example, location module 108 may perform the query "SELECT file_id, block_id, bytes FROM DBA_EXTENTS where segment_name=[TABLENAME]" where "[TABLENAME]" is the name of the database object that location module 108 is to locate within the database file. Location module 108 may then translate "file_id" and "block_id" to a filename of the database file within a file system and an offset within the database file, respectively.

As another example, location module 108 may identify the location of one or more rows within the database file. For example, location module 108 may identify a row identifier of a row that meets a compression criterion and translate the row identifier to a location within the database file. For example, an ORACLE DATABASE row identifier ("row-id") may include a 20 byte signature: the first six bytes specifying an object number, the next three bytes specifying a file number, the next six bytes specifying a block number, and the last three bytes specifying a row number. Location module 108 may use the file number to identify the database file and/or use the block number in conjunction with the database block size (e.g., "DB_BLOCK_SIZE") to calculate the offset of the row within the database file. As an example, the systems and methods described herein may acquire the row identifier as a part of a query for rows that meet the compression criterion. For example, one or more of the systems described herein may perform the query "SELECT rowid from CDR_table WHERE call_date>to_date('Dec. 1, 2011') and order_date<to_date ('Jan. 1, 2012')". In this example, "CDR_table" may represent a table including Call Detail Records of a telecommunications company.

As mentioned earlier, in some examples a database object may be striped across multiple database files. Accordingly, in some examples location module 108 may identify the location of the database object within multiple database files. In some examples, location module 108 may generate one or more (filename, offset, length) tuples to describe the location of the database object within one or more database files.

In some examples, location module 108 may determine that a candidate (file, offset, length) range for compression is not table free space. For example, location module 108 may determine that object rows reside within the candidate (file, offset, length) range.

Returning to FIG. 3, at step 308 one or more of the systems described herein may compress a portion of the database file at the location of the database object without compressing all of the database file. For example, at step 308 compression module 110 may, as part of computing device 202 in FIG. 2, compress a portion of database file 220 at location 240 of database object 212 without compressing all of database file 220.

In some examples, compression module 110 may compress the portion of the database file while leaving an additional portion of the database file that corresponds to the additional database object (e.g., that did not meet the compression criterion) uncompressed. Accordingly, the systems and methods described herein may achieve compression of database objects on a file system level.

Compression module 110 may compress the portion of the database file in any suitable manner. For example, compression module 110 may use one or more (filename, offset, length). Compression module 110 may copy the blocks underlying the (filename, offset, length) tuples to memory and compress the data stored in the blocks. In some examples, compression module 110 may create a temporary inode, update the block map of the temporary inode to match an inode corresponding to the data being compressed, write the compressed data to disk, and insert references to the compressed data into the block map of the temporary inode. In some examples, compression module 110 may verify that no changes have been performed on the original data range and may atomically swap the block maps of the original inode and the temporary inode. Accordingly, future attempts to access the original data may result in read operations performed on the compressed data.

Compression module 110 may compress the portion of the database in any suitable context. For example, compression module 110 may compress the portion of the database while the database is online. For example, by creating a temporary inode that references the compressed data and atomically swapping the temporary inode with the original inode, the systems and methods described herein may facilitating performing the compression without shutting down the database.

As explained above, by identifying specific database objects to compress, identifying database file extents that correspond to the selected database objects, and performing partial file compression on the corresponding file extents, the systems and methods described herein may facilitate the compression of selected database objects (including already existing database objects) so as to maximize space savings while minimizing performance costs and without requiring transferring the database objects to new containers and/or rebuilding invalidated indexes. In addition, these systems and methods may avoid compressing table free space and, in some examples, may facilitate periodic compression of past updates to databases.

Figure 5:
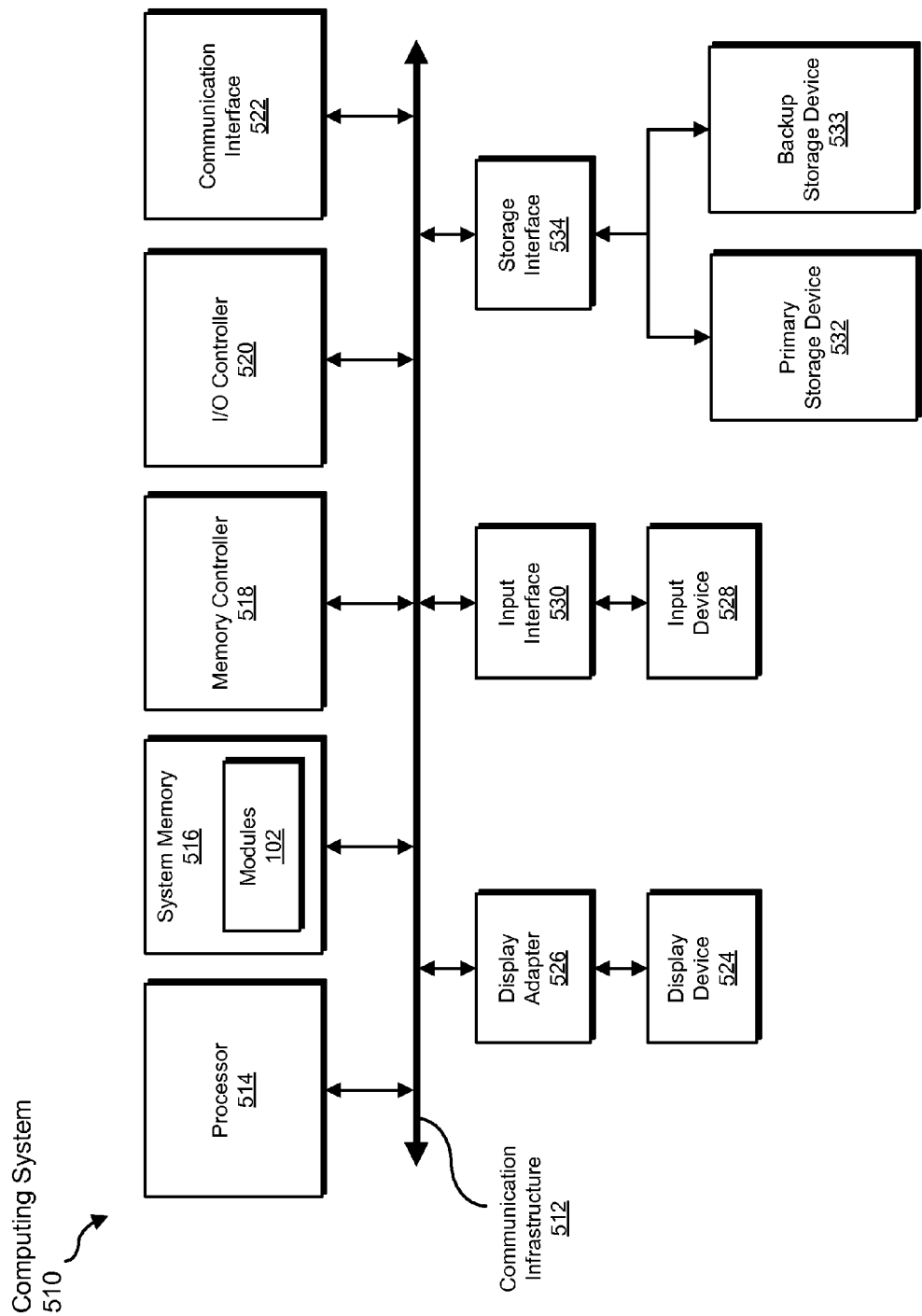
FIG. 5 is a block diagram of an exemplary computing system capable of implementing one or more of the embodiments described and/or illustrated herein.

FIG. 5 is a block diagram of an exemplary computing system 510 capable of implementing one or more of the embodiments described and/or illustrated herein. For example, all or a portion of computing system 510 may perform and/or be a means for performing, either alone or in combination with other elements, one or more of the identifying, determining, querying, and compressing steps described herein. All or a portion of computing system 510 may also perform and/or be a means for performing any other steps, methods, or processes described and/or illustrated herein.

Computing system 510 broadly represents any single or multi-processor computing device or system capable of executing computer-readable instructions. Examples of computing system 510 include, without limitation, workstations, laptops, client-side terminals, servers, distributed computing systems, handheld devices, or any other computing system or device. In its most basic configuration, computing system 510 may include at least one processor 514 and a system memory 516.

Processor 514 generally represents any type or form of processing unit capable of processing data or interpreting and executing instructions. In certain embodiments, processor 514 may receive instructions from a software application or module. These instructions may cause processor 514 to perform the functions of one or more of the exemplary embodiments described and/or illustrated herein.

System memory 516 generally represents any type or form of volatile or non-volatile storage device or medium capable of storing data and/or other computer-readable instructions. Examples of system memory 516 include, without limitation, Random Access Memory (RAM), Read Only Memory (ROM), flash memory, or any other suitable memory device. Although not required, in certain embodiments computing system 510 may include both a volatile memory unit (such as, for example, system memory 516) and a non-volatile storage device (such as, for example, primary storage device 532, as described in detail below). In one example, one or more of modules 102 from FIG. 1 may be loaded into system memory 516.

In certain embodiments, exemplary computing system 510 may also include one or more components or elements in addition to processor 514 and system memory 516. For example, as illustrated in FIG. 5, computing system 510 may include a memory controller 518, an Input/Output (I/O) controller 520, and a communication interface 522, each of which may be interconnected via a communication infrastructure 512. Communication infrastructure 512 generally represents any type or form of infrastructure capable of facilitating communication between one or more components of a computing device. Examples of communication infrastructure 512 include, without limitation, a communication bus (such as an Industry Standard Architecture (ISA), Peripheral Component Interconnect (PCI), PCI Express (PCIe), or similar bus) and a network.

Memory controller 518 generally represents any type or form of device capable of handling memory or data or controlling communication between one or more components of computing system 510. For example, in certain embodiments memory controller 518 may control communication between processor 514, system memory 516, and I/O controller 520 via communication infrastructure 512.

I/O controller 520 generally represents any type or form of module capable of coordinating and/or controlling the input and output functions of a computing device. For example, in certain embodiments I/O controller 520 may control or facilitate transfer of data between one or more elements of computing system 510, such as processor 514, system memory 516, communication interface 522, display adapter 526, input interface 530, and storage interface 534.

Communication interface 522 broadly represents any type or form of communication device or adapter capable of facilitating communication between exemplary computing system 510 and one or more additional devices. For example, in certain embodiments communication interface 522 may facilitate communication between computing system 510 and a private or public network including additional computing systems. Examples of communication interface 522 include, without limitation, a wired network interface (such as a network interface card), a wireless network interface (such as a wireless network interface card), a modem, and any other suitable interface. In at least one embodiment, communication interface 522 may provide a direct connection to a remote server via a direct link to a network, such as the Internet. Communication interface 522 may also indirectly provide such a connection through, for example, a local area network (such as an Ethernet network), a personal area network, a telephone or cable network, a cellular telephone connection, a satellite data connection, or any other suitable connection.

In certain embodiments, communication interface 522 may also represent a host adapter configured to facilitate communication between computing system 510 and one or more additional network or storage devices via an external bus or communications channel. Examples of host adapters include, without limitation, Small Computer System Interface (SCSI) host adapters, Universal Serial Bus (USB) host adapters, Institute of Electrical and Electronics Engineers (IEEE) 1394 host adapters, Advanced Technology Attachment (ATA), Parallel ATA (PATA), Serial ATA (SATA), and External SATA (eSATA) host adapters, Fibre Channel interface adapters, Ethernet adapters, or the like. Communication interface 522 may also allow computing system 510 to engage in distributed or remote computing. For example, communication interface 522 may receive instructions from a remote device or send instructions to a remote device for execution.

As illustrated in FIG. 5, computing system 510 may also include at least one display device 524 coupled to communication infrastructure 512 via a display adapter 526. Display device 524 generally represents any type or form of device capable of visually displaying information forwarded by display adapter 526. Similarly, display adapter 526 generally represents any type or form of device configured to forward graphics, text, and other data from communication infrastructure 512 (or from a frame buffer, as known in the art) for display on display device 524.

As illustrated in FIG. 5, exemplary computing system 510 may also include at least one input device 528 coupled to communication infrastructure 512 via an input interface 530. Input device 528 generally represents any type or form of input device capable of providing input, either computer or human generated, to exemplary computing system 510. Examples of input device 528 include, without limitation, a keyboard, a pointing device, a speech recognition device, or any other input device.

As illustrated in FIG. 5, exemplary computing system 510 may also include a primary storage device 532 and a backup storage device 533 coupled to communication infrastructure 512 via a storage interface 534. Storage devices 532 and 533 generally represent any type or form of storage device or medium capable of storing data and/or other computer-readable instructions. For example, storage devices 532 and 533 may be a magnetic disk drive (e.g., a so-called hard drive), a solid state drive, a floppy disk drive, a magnetic tape drive, an optical disk drive, a flash drive, or the like. Storage interface 534 generally represents any type or form of interface or device for transferring data between storage devices 532 and 533 and other components of computing system 510. In one example, database 120 from FIG. 1 may be stored in primary storage device 532.

In certain embodiments, storage devices 532 and 533 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 532 and 533 may also include other similar structures or devices for allowing computer software, data, or other computer-readable instructions to be loaded into computing system 510. For example, storage devices 532 and 533 may be configured to read and write software, data, or other computer-readable information. Storage devices 532 and 533 may also be a part of computing system 510 or may be a separate device accessed through other interface systems.

Many other devices or subsystems may be connected to computing system 510. Conversely, all of the components and devices illustrated in FIG. 5 need not be present to practice the embodiments described and/or illustrated herein. The devices and subsystems referenced above may also be interconnected in different ways from that shown in FIG. 5. Computing system 510 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable-storage medium. The phrase "computer-readable-storage medium" generally refers to any form of device, carrier, or medium capable of storing or carrying computer-readable instructions. Examples of computer-readable-storage media include, without limitation, transmission-type media, such as carrier waves, and non-transitory-type media, such as magnetic-storage media (e.g., hard disk drives and floppy disks), optical-storage media (e.g., Compact Disks (CDs) or Digital Video Disks (DVDs)), electronic-storage media (e.g., solid-state drives and flash media), and other distribution systems.

The computer-readable-storage medium containing the computer program may be loaded into computing system 510. All or a portion of the computer program stored on the computer-readable-storage medium may then be stored in system memory 516 and/or various portions of storage devices 532 and 533. When executed by processor 514, a computer program loaded into computing system 510 may cause processor 514 to perform and/or be a means for performing the functions of one or more of the exemplary embodiments described and/or illustrated herein. Additionally or alternatively, one or more of the exemplary embodiments described and/or illustrated herein may be implemented in firmware and/or hardware. For example, computing system 510 may be configured as an Application Specific Integrated Circuit (ASIC) adapted to implement one or more of the exemplary embodiments disclosed herein.

Figure 6:
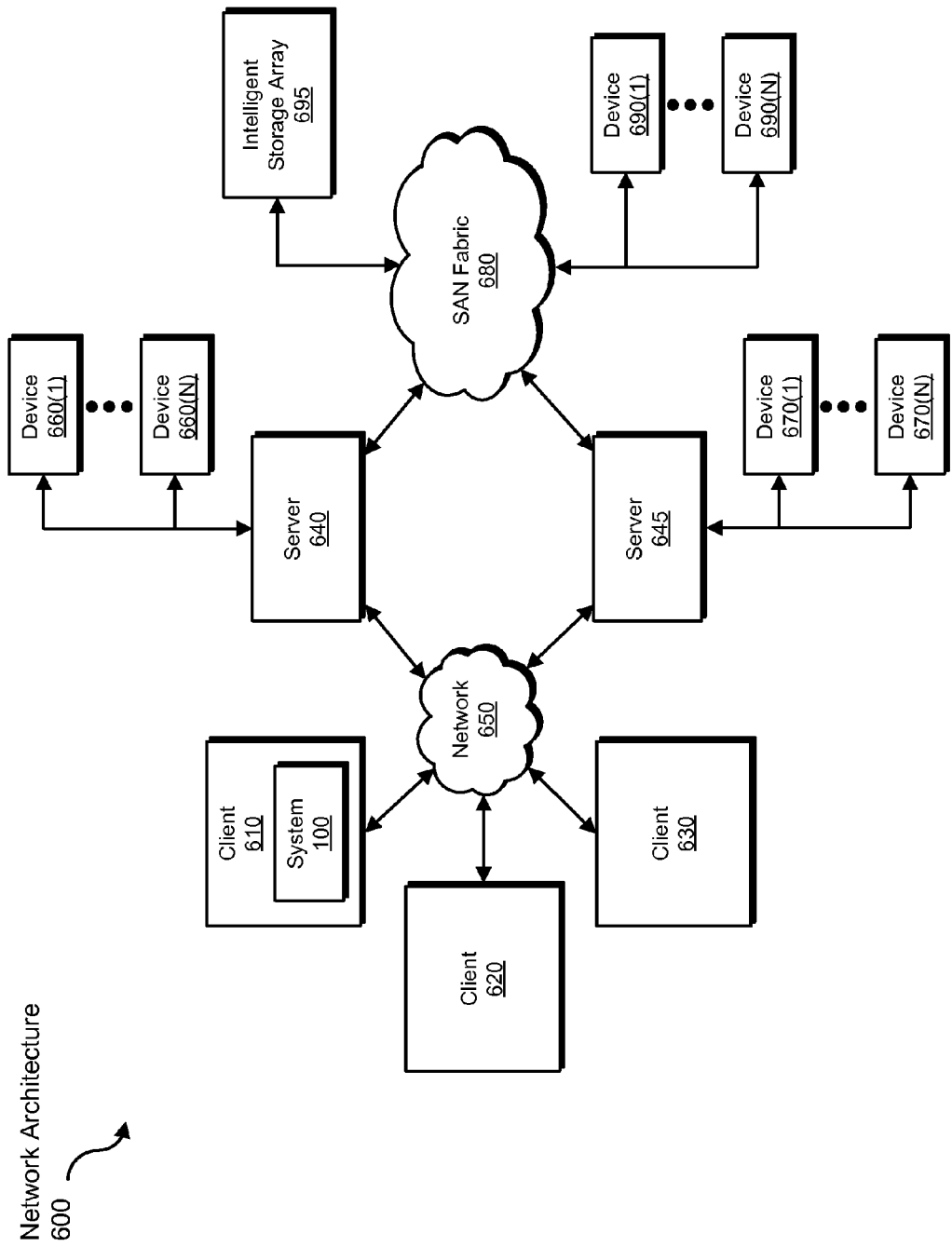
FIG. 6 is a block diagram of an exemplary computing network capable of implementing one or more of the embodiments described and/or illustrated herein.

FIG. 6 is a block diagram of an exemplary network architecture 600 in which client systems 610, 620, and 630 and servers 640 and 645 may be coupled to a network 650. As detailed above, all or a portion of network architecture 600 may perform and/or be a means for performing, either alone or in combination with other elements, one or more of the identifying, determining, querying, and compressing steps disclosed herein. All or a portion of network architecture 600 may also be used to perform and/or be a means for performing other steps and features set forth in the instant disclosure.

Client systems 610, 620, and 630 generally represent any type or form of computing device or system, such as exemplary computing system 510 in FIG. 5. Similarly, servers 640 and 645 generally represent computing devices or systems, such as application servers or database servers, configured to provide various database services and/or run certain software applications. Network 650 generally represents any telecommunication or computer network including, for example, an intranet, a WAN, a LAN, a PAN, or the Internet. In one example, client systems 610, 620, and/or 630 and/or servers 640 and/or 645 may include all or a portion of system 100 from FIG. 1.

As illustrated in FIG. 6, one or more storage devices 660(1)-(N) may be directly attached to server 640. Similarly, one or more storage devices 670(1)-(N) may be directly attached to server 645. Storage devices 660(1)-(N) and storage devices 670(1)-(N) generally represent any type or form of storage device or medium capable of storing data and/or other computer-readable instructions. In certain embodiments, storage devices 660(1)-(N) and storage devices 670(1)-(N) may represent Network-Attached Storage (NAS) devices configured to communicate with servers 640 and 645 using various protocols, such as Network File System (NFS), Server Message Block (SMB), or Common Internet File System (CIFS).

Servers 640 and 645 may also be connected to a Storage Area Network (SAN) fabric 680. SAN fabric 680 generally represents any type or form of computer network or architecture capable of facilitating communication between a plurality of storage devices. SAN fabric 680 may facilitate communication between servers 640 and 645 and a plurality of storage devices 690(1)-(N) and/or an intelligent storage array 695. SAN fabric 680 may also facilitate, via network 650 and servers 640 and 645, communication between client systems 610, 620, and 630 and storage devices 690(1)-(N) and/or intelligent storage array 695 in such a manner that devices 690(1)-(N) and array 695 appear as locally attached devices to client systems 610, 620, and 630. As with storage devices 660(1)-(N) and storage devices 670(1)-(N), storage devices 690(1)-(N) and intelligent storage array 695 generally represent any type or form of storage device or medium capable of storing data and/or other computer-readable instructions.

In certain embodiments, and with reference to exemplary computing system 510 of FIG. 5, a communication interface, such as communication interface 522 in FIG. 5, may be used to provide connectivity between each client system 610, 620, and 630 and network 650. Client systems 610, 620, and 630 may be able to access information on server 640 or 645 using, for example, a web browser or other client software. Such software may allow client systems 610, 620, and 630 to access data hosted by server 640, server 645, storage devices 660(1)-(N), storage devices 670(1)-(N), storage devices 690(1)-(N), or intelligent storage array 695. Although FIG. 6 depicts the use of a network (such as the Internet) for exchanging data, the embodiments described and/or illustrated herein are not limited to the Internet or any particular network-based environment.

In at least one embodiment, all or a portion of one or more of the exemplary embodiments disclosed herein may be encoded as a computer program and loaded onto and executed by server 640, server 645, storage devices 660(1)-(N), storage devices 670(1)-(N), storage devices 690(1)-(N), intelligent storage array 695, or any combination thereof. All or a portion of one or more of the exemplary embodiments disclosed herein may also be encoded as a computer program, stored in server 640, run by server 645, and distributed to client systems 610, 620, and 630 over network 650.

As detailed above, computing system 510 and/or one or more components of network architecture 600 may perform and/or be a means for performing, either alone or in combination with other elements, one or more steps of an exemplary method for compressing database objects.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of exemplary system 100 in FIG. 1 may represent portions of a cloud-computing or network-based environment. Cloud-computing environments may provide various services and applications via the Internet. These cloud-based services (e.g., software as a service, platform as a service, infrastructure as a service, etc.) may be accessible through a web browser or other remote interface. Various functions described herein may be provided through a remote desktop environment or any other cloud-based computing environment.

In various embodiments, all or a portion of exemplary system 100 in FIG. 1 may facilitate multi-tenancy within a cloud-based computing environment. In other words, the software modules described herein may configure a computing system (e.g., a server) to facilitate multi-tenancy for one or more of the functions described herein. For example, one or more of the software modules described herein may program a server to enable two or more clients (e.g., customers) to share an application that is running on the server. A server programmed in this manner may share an application, operating system, processing system, and/or storage system among multiple customers (i.e., tenants). One or more of the modules described herein may also partition data and/or configuration information of a multi-tenant application for each customer such that one customer cannot access data and/or configuration information of another customer.

According to various embodiments, all or a portion of exemplary system 100 in FIG. 1 may be implemented within a virtual environment. For example, modules and/or data described herein may reside and/or execute within a virtual machine. As used herein, the phrase "virtual machine" generally refers to any operating system environment that is abstracted from computing hardware by a virtual machine manager (e.g., a hypervisor). Additionally or alternatively, the modules and/or data described herein may reside and/or execute within a virtualization layer. As used herein, the phrase "virtualization layer" generally refers to any data layer and/or application layer that overlays and/or is abstracted from an operating system environment. A virtualization layer may be managed by a software virtualization solution (e.g., a file system filter) that presents the virtualization layer as though it were part of an underlying base operating system. For example, a software virtualization solution may redirect calls that are initially directed to locations within a base file system and/or registry to locations within a virtualization layer.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

While various embodiments have been described and/or illustrated herein in the context of fully functional computing systems, one or more of these exemplary embodiments may be distributed as a program product in a variety of forms, regardless of the particular type of computer-readable-storage media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may configure a computing system to perform one or more of the exemplary embodiments disclosed herein.

In addition, one or more of the modules described herein may transform data, physical devices, and/or representations of physical devices from one form to another. For example, one or more of the modules recited herein may receive a database file with an uncompressed database object to be transformed, transform the database object by compressing the database object, output a result of the transformation to the database file, use the result of the transformation to store the database object more efficiently, and store the result of the transformation to a storage device. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising."

What is claimed is:

1. A computer-implemented method for compressing database objects, at least a portion of the method being performed by a computing device comprising at least one processor, the method comprising:
   identifying a database object within a relational database;
   determining that the database object meets a compression criterion that is not met by at least one additional database object within the relational database;

identifying a location of the database object within a database file of the relational database by querying a catalog table of the relational database that stores extent information for the database object, the extent information identifying the database file and an offset within the database file at which at least a portion of the database object is located;

compressing a portion of the database file at the location of the database object without compressing all of the database file.

2. The computer-implemented method of claim 1, wherein compressing the portion of the database file at the location of the database object comprises compressing the portion of the database file while leaving an additional portion of the database file that corresponds to the additional database object uncompressed.

3. The computer-implemented method of claim 1, wherein determining that the database object meets a compression criterion comprises determining that an age of the database object exceeds a predetermined threshold.

4. The computer-implemented method of claim 1, wherein determining that the database object meets the compression criterion comprises at least one of:
 determining that the database object comprises a table;
 determining that the database object comprises a composite index that indexes a plurality of columns.

5. The computer-implemented method of claim 1, wherein determining that the database object meets the compression criterion comprises determining that the database object comprises a read-only database object.

6. The computer-implemented method of claim 1, wherein determining that the database object meets the compression criterion comprises determining that a write frequency to the database object falls below a predetermined threshold.

7. The computer-implemented method of claim 1, wherein determining that the database object meets the compression criterion comprises determining that a size of the database object exceeds a predetermined threshold.

8. The computer-implemented method of claim 1, wherein identifying the database object comprises identifying at least one of:
 an index;
 a table;
 a set of rows.

9. The computer-implemented method of claim 1, wherein determining that the database object meets the compression criterion comprises determining that the database object comprises a file stored within the relational database.

10. A system for compressing databases, the system comprising:
 an identification module programmed to identify a database object within a relational database;
 a determination module programmed to determine that the database object meets a compression criterion that is not met by at least one additional database object within the relational database;
 a location module programmed to identify a location of the database object within a database file of the relational database by querying a catalog table of the relational database that stores extent information for the database object, the extent information identifying the database file and an offset within the database file at which at least a portion of the database object is located;
 a compression module programmed to compress a portion of the database file at the location of the database object without compressing all of the database file;
 at least one processor configured to execute the identification module, the determination module, the location module, and the compression module.

11. The system of claim 10, wherein the compression module is programmed to compress the portion of the database file at the location of the database object by compressing the portion of the database file while leaving an additional portion of the database file that corresponds to the additional database object uncompressed.

12. The system of claim 10, wherein the determination module is programmed to determine that the database object meets a compression criterion by determining that an age of the database object exceeds a predetermined threshold.

13. The system of claim 10, wherein the determination module is programmed to determine that the database object meets the compression criterion by at least one of:
 determining that the database object comprises a table;
 determining that the database object comprises a composite index that indexes a plurality of columns.

14. The system of claim 10, wherein the determination module is programmed to determine that the database object meets the compression criterion by determining that the database object comprises a read-only database object.

15. The system of claim 10, wherein the determination module is programmed to determine that the database object meets the compression criterion by determining that a write frequency to the database object falls below a predetermined threshold.

16. The system of claim 10, wherein the determination module is programmed to determine that the database object meets the compression criterion by determining that a size of the database object exceeds a predetermined threshold.

17. The system of claim 10, wherein the identification module is programmed to identify the database object by identifying at least one of:
 an index;
 a table;
 a set of rows.

18. A non-transitory computer-readable medium comprising one or more computer-executable instructions that, when executed by at least one processor of a computing device, cause the computing device to:
 identify a database object within a relational database;
 determine that the database object meets a compression criterion that is not met by at least one additional database object within the relational database;
 identify a location of the database object within a database file of the relational database by querying a catalog table of the relational database that stores extent information for the database object, the extent information identifying the database file and an offset within the database file at which at least a portion of the database object is located;
 compress a portion of the database file at the location of the database object without compressing all of the database file.

19. The non-transitory computer-readable medium of claim 18, wherein compressing the portion of the database file at the location of the database object comprises compressing the portion of the database file while leaving an additional portion of the database file that corresponds to the additional database object uncompressed.

20. The non-transitory computer-readable medium of claim 18, wherein determining that the database object meets a compression criterion comprises determining that an age of the database object exceeds a predetermined threshold.

* * * * *